US009921446B2

(12) United States Patent
Yu et al.

(10) Patent No.: US 9,921,446 B2
(45) Date of Patent: Mar. 20, 2018

(54) DISPLAY PANEL TEST STRUCTURE

(71) Applicants: BOE TECHNOLOGY GROUP CO., LTD., Beijing (CN); BEIJING BOE DISPLAY TECHNOLOGY CO., LTD, Beijing (CN)

(72) Inventors: Fengwu Yu, Beijing (CN); Jinhu Cao, Beijing (CN); Minghui Ma, Beijing (CN); Bin Cao, Beijing (CN); Namin Kwon, Beijing (CN); Yanyan Wu, Beijing (CN); Wei Li, Beijing (CN); Mian Gao, Beijing (CN); Long Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/227,208

(22) Filed: Aug. 3, 2016

(65) Prior Publication Data
US 2017/0192326 A1 Jul. 6, 2017

(30) Foreign Application Priority Data
Jan. 5, 2016 (CN) .......................... 2016 1 0007079

(51) Int. Cl.
*G02F 1/1362* (2006.01)
*G01R 31/02* (2006.01)
*G02F 1/1368* (2006.01)

(52) U.S. Cl.
CPC ..... *G02F 1/136259* (2013.01); *G01R 31/025* (2013.01); *G02F 1/1368* (2013.01);
(Continued)

(58) Field of Classification Search
CPC ............. G01R 31/025; G02F 1/136259; G02F 1/1368; G02F 1/136286; G02F 2001/136263
See application file for complete search history.

(56) References Cited

U.S. PATENT DOCUMENTS

| 5,668,032 A * | 9/1997 | Holmberg | G02F 1/136204 257/59 |
|---|---|---|---|
| 6,392,719 B2 * | 5/2002 | Kim | G02F 1/136204 349/192 |
| 2015/0262536 A1 * | 9/2015 | Chen | G02F 1/1368 345/92 |

FOREIGN PATENT DOCUMENTS

| CN | 101364022 A | 2/2009 |
|---|---|---|
| CN | 102566167 A | 7/2012 |
| CN | 103399422 A | 11/2013 |

OTHER PUBLICATIONS

First Office Action dated Nov. 16, 2017 corresponding to Chinese application No. 201610007079.X.

* cited by examiner

*Primary Examiner* — Patrick Assouad
*Assistant Examiner* — Haidong Zhang
(74) *Attorney, Agent, or Firm* — Nath, Goldberg & Meyer; Joshua B. Goldberg; Annie J. Kock

(57) ABSTRACT

The present application discloses a display panel test structure for testing whether signal lines of a display panel are defective, the signal lines at least comprising a plurality of data lines which are divided into N groups, the display panel test structure comprising N first shorting bars arranged in a test area of the display panel, each of which being configured to short-circuit a group of data lines, wherein the display panel test structure further comprises a plurality of first test pads arranged in the test area, each of which connects with one shorting bar corresponding thereto, and
(Continued)

each of the first test pads is configured to load a signal to a group of data lines corresponding thereto during a test.

10 Claims, 2 Drawing Sheets

(52) U.S. Cl.
 CPC ................ *G02F 1/136286* (2013.01); *G02F 2001/136263* (2013.01)

DISPLAY PANEL TEST STRUCTURE

CROSS-REFERENCES TO RELATED APPLICATIONS

The present application claims priority to Chinese Patent Application No. 201610007079.X, filed on Jan. 5, 2016, the disclosure of which is hereby incorporated by reference in its entirety.

FIELD

The present invention relates to the field of display technology, and particularly, to a display panel test structure.

BACKGROUND

In recent years, thin film transistor liquid crystal display (TFT-LCD) devices have been rapidly developed and play a dominant position in flat display market due to their characteristics of small volume, low power consumption, no radiation and the like.

The fabricating process of TFT-LCDs includes a step of assembling a fabricated array substrate and a fabricated color filter substrate together by using a sealant, so as to form a display panel. After the formation of the display panel, various tests are performed on the display panel, including performing test on the display panel by using a display panel test structure.

FIG. 1 is a diagram illustrating a display panel test structure in the prior art. FIG. 1 shows a display area Q1 and a lead area Q2 of a display panel, the lead area Q2 being located at a peripheral area of the display area Q1. As shown in FIG. 1, a plurality of gate lines 20 and a plurality of data lines 10, which are intersected with each other, are provided in the display area Q1. In a case where the display panel is a single-side-driving display panel, both an end of each gate line 20 and an end of each data line 10 extend from the display area Q1 into the lead area Q2, so that signals can be loaded to the gate lines 20 and the data lines 10. In this case, before inputting display signals to the gate lines 20 and the data lines 10, the condition of the gate lines 20 and the data lines 10 has to be tested, so that whether these signal lines are defective can be determined.

As an example, a display panel test structure for testing whether the data lines 10 are defective will be described below. Referring to FIG. 1, the display panel test structure for testing whether the data lines 10 are defective generally includes shorting bars 30, which are arranged in a test area Q3. The test area Q3 is arranged in a peripheral area of the lead area Q2 of the display panel. For a single display panel, a structure called 6D Shorting Bar is generally employed, in which the data lines 10 are divided into six groups, in each of which the data lines 10 are short-circuited together through a shorting bar 30. In a test procedure, a plurality of block pins (test probes) contact a plurality of data lines 10 in the lead area Q2, respectively, i.e., a block pin contacts a data line 10 corresponding thereto, so that signals are loaded to the respective data lines 10. By such arrangement, even in a case where an individual block pin experiences a situation called Pin-miss (i.e., a situation in which some block pin fails to contact a data line 10 corresponding thereto, resulting in that signals cannot be loaded to said data line 10), since data lines 10 in a same group are short-circuited together through a shorting bar 30, the pin-missed data line 10 can be loaded with signals through other data lines 10 short-circuited therewith and from the same group. Therefore, it is possible to ensure that defective of each data line 10 can be detected.

However, the inventors have found at least the following defects existing in the prior art, including: (1), in the dot-inversion or line-inversion mode, polarities of driving voltages of two adjacent data lines 10 are opposite to each other, and in this case, once two adjacent block pins are short-circuited, an excessive current will be produced, burning down the data lines 10 or causing abnormalities of signal loading; and (2), a large number of small block pins are employed, so that data lines 10 on the display panel may be scratched when contacting block pins.

SUMMARY

In view of the above problems existing in the prior display panel test structure, the present invention provides a display panel test structure, which can prevent the display panel from being burnt down or scratched.

An embodiment of the present invention provides a display panel test structure for testing whether signal lines of a display panel are defective, the signal lines at least comprising a plurality of data lines which are divided into N groups, the display panel test structure comprising N first shorting bars arranged in a test area of the display panel, each of which being configured to short-circuit a group of data lines, wherein the display panel test structure further comprises a plurality of first test pads arranged in the test area, each of which connects with one shorting bar corresponding thereto, and each of the first test pads is configured to load a signal to a group of data lines corresponding thereto during a test.

Optionally, N is two.

Further optionally, the data lines in odd columns are connected with a same first shorting bar, the data lines in even columns are connected with a same first shorting bar, and the data lines in the odd columns and the data lines in the even columns are connected with different first shorting bars, respectively.

Optionally, each first shorting bar has a resistance ranging from approximate 12 ohms to approximate 15 ohms.

Optionally, a distance between two adjacent first test pads is larger than a distance between two adjacent data lines.

Optionally, the display panel further comprises two gate driver circuits arranged opposite to each other; the signal lines further comprises a plurality of signal leading lines for loading signals to the gate driver circuits; and the display panel test structure further comprises a plurality of second shorting bars and a plurality of second test pads arranged in the test area, an end of each second shorting bar being connected with one second test pad corresponding thereto; wherein each second shorting bar is configured to short-circuit signal leading lines for loading a same signal among the plurality of signal leading lines; and each second test pad is configured to provide test signals to the signal leading lines for loading a same signal, respectively.

Further optionally, the display panel test structure further comprises second dummy test pads arranged at a same side as the first test pads, and first dummy test pads arranged at a same side as the second test pads; and wherein the first test pads and the second dummy test pads are substantially symmetric to the second test pads and the first dummy test pads with respect to an extending direction of the data line.

Optionally, the first test pad and the dummy second test pad have a same size.

Optionally, the second test pad and the dummy first test pad have a same size.

Optionally, the first test pad, the second test pad, the dummy first test pad, and the dummy second test pad have a same size.

Optionally, each second shorting bar has a resistance ranging from approximate 27 ohms to approximate 50 ohms.

Optionally, the display panel further comprises a plurality of gate lines intersecting with, and insulated from, the plurality of data lines; and wherein the first shorting bars and the gate lines are arranged in a same layer and made of a same material, and the first shorting bars are connected with the data lines by through holes penetrating through an insulating layer between the gate lines and the data lines.

In the display panel test structure described herein, a first test pad is added at an end of a first shorting bar, such that a block pin is only required to contact the first test pad to load a test signal to a group of data lines corresponding to the first test pad. Since a width of a first test pad is significantly larger than that of a data line and a distance between two adjacent first test pads can be larger than a distance between two adjacent data lines, the display panel test structure described herein can adequately ensure the contact stability between a first test pad and a block pin, while avoiding a short circuit between adjacent block pins. Moreover, by arranging a first test pad, a block pin contacts the first test pad instead of directly contacting a data line, so that the data line of the display panel will not be scratched even the block pin is small.

DETAILED DESCRIPTION OF THE EMBODIMENTS

To make those skilled in the art better understand the technical solutions of the present invention, the present invention will be described in detail below in conjunction with the accompanying drawings and specific embodiments.

First Embodiment

Figure 1:
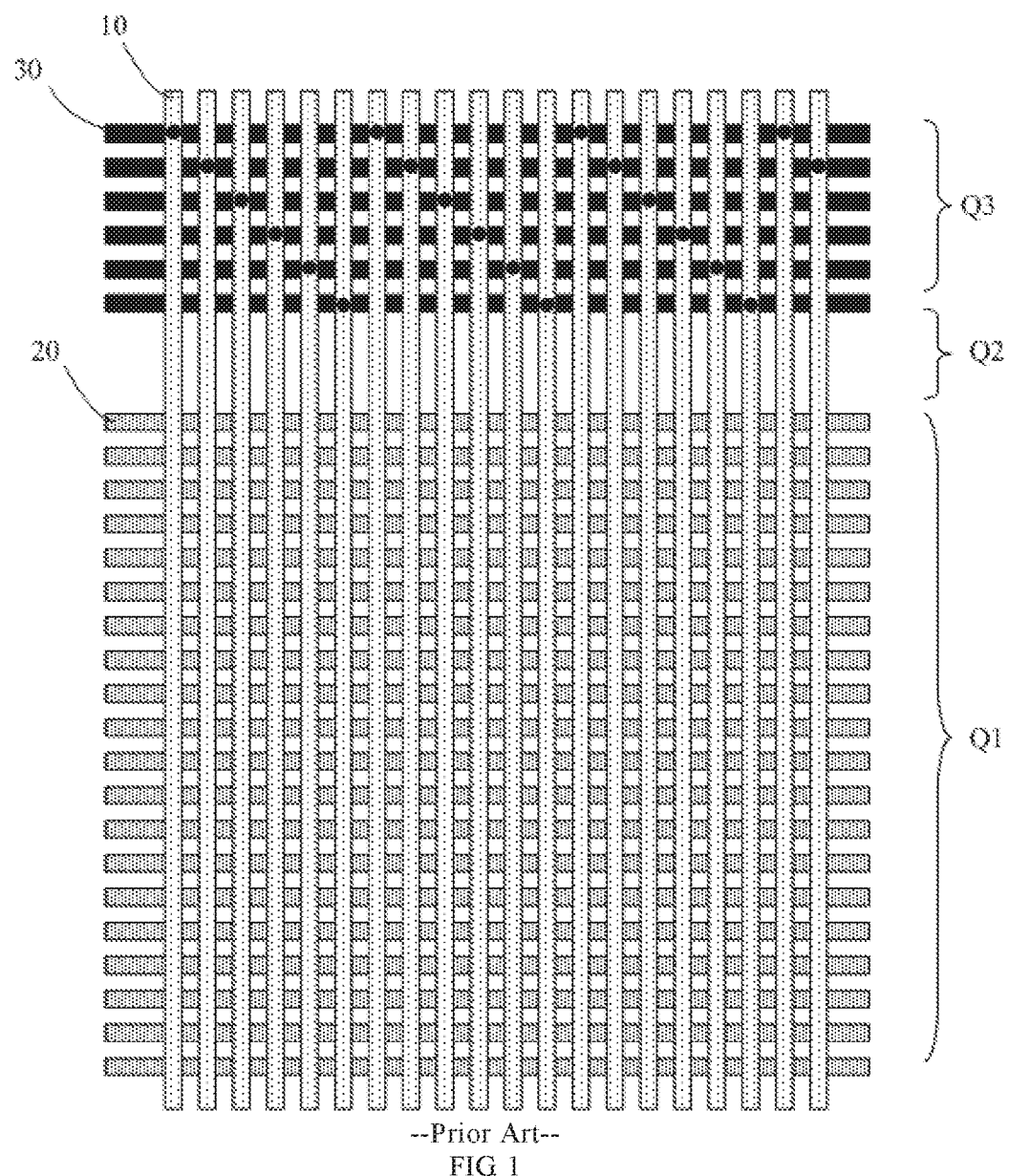
FIG. 1 is a diagram illustrating a display panel test structure in the prior art.
Figure 2:
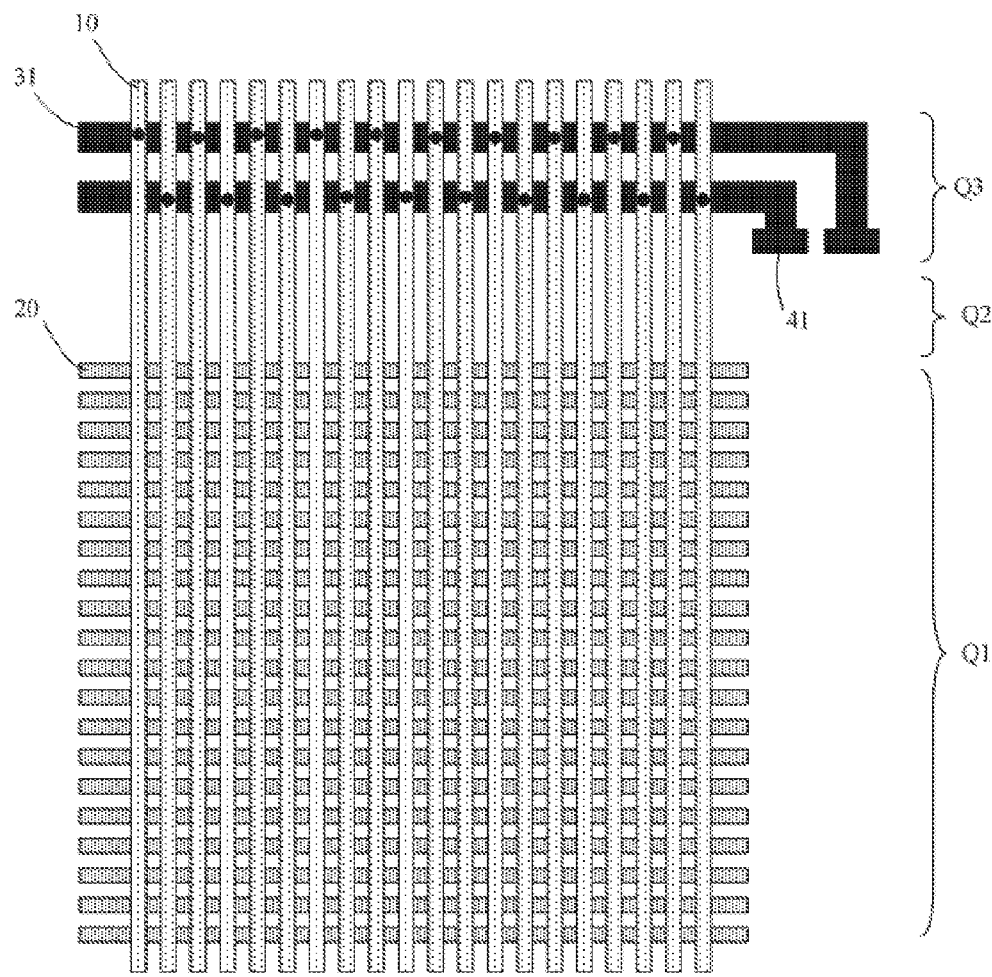
FIG. 2 is a diagram illustrating a display panel test structure in a first embodiment of the present invention.

The present embodiment provides a display panel test structure for testing whether signal lines of a display panel are defective. FIG. 2 is a diagram illustrating the display panel test structure in the present embodiment. As shown in FIG. 2, the display panel in the present embodiment can be divided, from inside to outside, into a display area Q1, a lead area Q2 and a test area Q3. The display area Q1 comprises a plurality of gate lines 20 and a plurality of data lines 10, which are intersected with and insulated from each other. One end of each data line 10 extends from the display area Q1 into the test area Q3 through the lead area Q2. The plurality of data lines 10 are divided into N groups, and the display panel test structure comprises N first shorting bars 31 and N first test pads 41 arranged in the test area Q3 of the display panel. One end of each first shorting bar 31 connects with one first test pad 41 corresponding thereto, and each first shorting bar 31 is configured to short-circuit a group of data lines 10 together. During testing defective of data lines 10, it is only required to make a block pin contact a first test pad 41, thereby loading a test signal to a group of data lines 10 corresponding to the first test pad 41.

In the present embodiment, compared to the prior art, a first test pad 41 is added at one end of a first shorting bar 31, such that a block pin is only required to contact the first test pad 41 to load a test signal to a group of data lines 10 corresponding to the first test pad 41. In the present embodiment, a width of a first test pad 41 is significantly larger than that of a data line 10 and a distance between two adjacent first test pads 41 can be larger than a distance between two adjacent data lines 10, thus, compared to the prior art, the display panel test structure in the present embodiment can adequately ensure the contact stability between a first test pad 41 and a block pin, while avoiding a short circuit between adjacent block pins. Moreover, by arranging a first test pad 41, a block pin contacts the first test pad 41 instead of directly contacting a data line 10, so that the data line 10 of the display panel will not be scratched even the block pin is small.

Optionally, N is two, that is, the display panel test structure comprises two first shorting bars 31. Accordingly, the plurality of data lines 10 are divided into two groups, where one of the two first shorting bars connects with one of the two groups of data lines 10, and the other one of the two first shorting bars 31 connects with the other one of the two groups of data lines 10. Further optionally, the data lines 10 in odd columns are connected with a same first shorting bar 31, the data lines 10 in even columns are connected with a same first shorting bar 31, and the data lines 10 in the odd columns and the data lines 10 in the even columns are connected with different first shorting bars 31, respectively. In this way, it is possible to avoid an erroneous determination due to signal delay when loading a test signal, to the largest extent. Certainly, the number of the first shorting bars is not limited to two, and it can be set in accordance with actual needs.

The design of the display panel test structure in the present embodiment has the following advantages. Compared to a width of a shorting bar 30 in the 6D Shorting Bar structure in the prior art, a width of a shorting bar 30 in the present embodiment can be wider, so that a resistance thereof can be effectively reduced, avoiding signal attenuation; by providing at one end of each first shorting bar 31 a first test pad 41 corresponding thereto, the number of block pins can be significantly reduced (approximate 1000 vs. minimum 2); the contact stability between a first test pad 41 and a block pin is better, and scratches of data lines 10, and burn of data lines 10 due to a short circuit between adjacent block pins, can be effectively avoided.

In the present embodiment, each first shorting bar 31 has a resistance ranging from approximate 12 ohms to approximate 15 ohms. A distance between two adjacent first test pads 41 is larger than a distance between two adjacent data lines 10, so that burn of data lines 10 due to a short circuit between adjacent block pins can be effectively avoided.

In the present embodiment, the first shorting bars 31 and the gate lines 20 are arranged in a same layer and made of a same material, and the first shorting bars 31 are connected with the data lines 10 by through holes penetrating through an insulating layer between the gate lines 20 and the data lines 10. That is to say, the gate lines 20 and the first shorting bars 31 may be fabricated in a single patterning process, thereby reducing production cost and improving production efficiency.

In general, in the display panel test structure of the present embodiment, a first test pad 41 is added at one end of a first shorting bar 31, such that a block pin is only required to contact the first test pad 41 to load a test signal to a group of data lines 10 corresponding to the first test pad 41. In the present embodiment, a width of a first test pad 41 is significantly larger than that of a data line 10 and a distance between two adjacent first test pads 41 can be larger than a distance between two adjacent data lines 10, thus the display panel test structure in the present embodiment can adequately ensure the contact stability between a first test pad 41 and a block pin, while avoiding a short circuit between adjacent block pins. Moreover, by arranging a first test pad 41, a block pin contacts the first test pad 41 instead of directly contacting a data line 10, so that the data line 10 of the display panel will not be scratched even the block pin is small.

Second Embodiment

The present embodiment provides a display panel test structure, which includes the display panel test structure in the first embodiment, description of which will be omitted. It is well known for a person skilled in the art that, display panels can be classified into a single-side-driving display panel and a double-side-driving display panel. The single-side-driving display panel is a display panel in which one end of a gate line is connected with a gate driver circuit, whereas the double-side-driving display panel is a display panel in which both ends of a gate line are connected with two gate driver circuits respectively, and the two gate driver circuits are arranged opposite to each other. To realize narrow bezel and reduce production cost, a popular structure of gate driver circuit is called GOA (Gate on Array) circuit, in which the gate driver circuit is arranged on a display panel. In the present embodiment, description of the display panel test structure in the present embodiment will be made using a display panel in which two gate driver circuits (i.e., GOA circuit) are arranged opposite to each other as an example.

Figure 3:
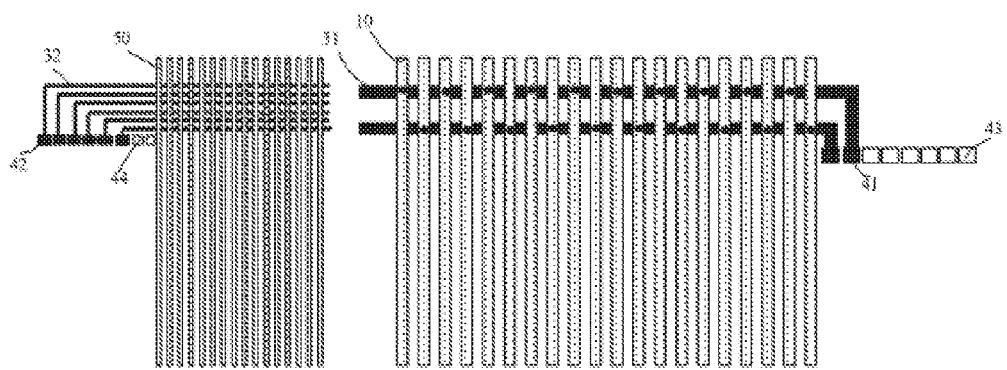
FIG. 3 is a diagram illustrating a display panel test structure in a second embodiment of the present invention.

FIG. 3 is a diagram illustrating a display panel test structure in the second embodiment of the present invention. As shown in FIG. 3, the present display panel further comprises a plurality of signal leading lines 50 for loading signals to the gate driver circuits, such as a first clock signal line, a second clock signal line, a frame gating signal line. It should be noted that, for sake of convenience, FIG. 3 only shows signal leading lines for loading signals to a gate driver circuit (GOA circuit) at one side of a display panel, and signal leading lines for loading signals to a gate driver circuit (GOA circuit) at the other side of the display panel are arranged in a similar way. In the present embodiment, the display panel test structure further comprises a plurality of second shorting bars 32 and a plurality of second test pads 42 arranged in the test area Q3, an end of each second shorting bar 32 being connected with one second test pad 42 corresponding thereto; each second shorting bar 32 is configured to short-circuit signal leading lines 50 for loading a same signal among the plurality of signal leading lines 50; and each second test pad 42 is configured to provide test signals to the signal leading lines 50 for loading a same signal, respectively.

In the present embodiment, defective of the plurality of signal leading lines 50 connected with the gate driver circuit is tested in a similar way as that of the data lines 10 in the first embodiment, and will not be described in detail herein.

Optionally, the display panel test structure in the present embodiment further comprises second dummy test pads 43 arranged at a same side as the first test pads 41, and first dummy test pads 44 arranged at a same side as the second test pads 42. Optionally, the first test pad 41 and the dummy second test pad 43 have a same size. Optionally, the second test pad 42 and the dummy first test pad 44 have a same size. Optionally, the first test pad 41, the second test pad 42, the dummy first test pad 44, and the dummy second test pad 43 have a same size. Optionally, the first test pads 41 and the second dummy test pads 43 are substantially symmetric to the second test pads 42 and the first dummy test pads 44 with respect to an extending direction of the data line 10. Optionally, each second shorting bar 32 has a resistance ranging from approximate 27 ohms to approximate 50 ohms.

By arranging the dummy second test pads 43 and the dummy first test pads 44, the block pins configured to test defective of data lines 10 and the block pins configured to test defective of a plurality of signal leading lines 50 connected with a gate driver circuit can be of versatility, thereby reducing production cost. Moreover, for designs of various models of display panels, all the first test pads 41 and all the second test pads 42 have a same relative positional relationship. The block pins are suspend at positions without signals, and contact the first test pads 41 and the second test pads 42 at positions of the first test pads 41 and the second pads 42. Moreover, various models of products can use a same kind of block pins.

In general, similar to the first embodiment, a second test pad 42 is added at an end of a second shorting bar 32 configured to short-circuit signal leading lines 50 for loading signals to a gate driver circuit, so that a burn of a display panel resulted by an excessive current in a signal leading line 50 due to a short circuit between adjacent block pins can also be avoided. Moreover, by arranging a second test pad 42, a block pin contact the second test pad 42 instead of directly contacting a signal leading line 50, so that the signal leading line of the display panel will not be scratched even the block pin is small.

It could be understood that the above embodiments are merely exemplary embodiments adopted for describing the principle of the present invention, but the present invention is not limited thereto. Various variations and improvements may be made for those with ordinary skill in the art without departing from the spirit and essence of the present invention, and these variations and improvements shall also fall within the protection scope of the present invention.

What is claimed is:

1. A display panel test structure for testing whether signal lines of a display panel are defective, the signal lines at least comprising a plurality of data lines which are divided into N groups, N being an integer equal to or greater than two, the display panel test structure comprising N first shorting bars arranged in a test area of the display panel, each of which being configured to short-circuit a group of data lines, wherein the display panel test structure further comprises a plurality of first test pads arranged in the test area, each of which connects with one shorting bar corresponding thereto, and each of the first test pads is configured to load a signal to a group of data lines corresponding thereto during a test;

wherein the display panel further comprises two gate driver circuits arranged opposite to each other; the signal lines further comprises a plurality of signal leading lines for loading signals to the gate driver circuits; and the display panel test structure further comprises a plurality of second shorting bars and a plurality of second test pads arranged in the test area, an end of each second shorting bar being connected with one second test pad corresponding thereto;

wherein each second shorting bar is configured to short-circuit signal leading lines for loading a same signal among the plurality of signal leading lines; and each second test pad is configured to provide test signals to the signal leading lines for loading a same signal, respectively; and wherein the display panel test structure further comprises second dummy test pads arranged at a same side as the first test pads, and first dummy test pads arranged at a same side as the second test pads; and wherein the first test pads and the second dummy test pads are substantially symmetric to the second test pads and the first dummy test pads with respect to an extending direction of the data line.

2. The display panel test structure of claim 1, wherein N is two.

3. The display panel test structure of claim 2, wherein the data lines in odd columns are connected with a same first shorting bar, the data lines in even columns are connected with a same first shorting bar, and the data lines in the odd columns and the data lines in the even columns are connected with different first shorting bars, respectively.

4. The display panel test structure of claim 1, wherein each first shorting bar has a resistance ranging from approximate 12 ohms to approximate 15 ohms.

5. The display panel test structure of claim 1, wherein a distance between two adjacent first test pads is larger than a distance between two adjacent data lines.

6. The display panel test structure of claim 1, wherein the first test pad and the dummy second test pad have a same size.

7. The display panel test structure of claim 1, wherein the second test pad and the dummy first test pad have a same size.

8. The display panel test structure of claim 1, wherein the first test pad, the second test pad, the dummy first test pad, and the dummy second test pad have a same size.

9. The display panel test structure of claim 1, wherein each second shorting bar has a resistance ranging from approximate 27 ohms to approximate 50 ohms.

10. The display panel test structure of claim 1, wherein the display panel further comprises a plurality of gate lines intersecting with, and insulated from, the plurality of data lines; and wherein the first shorting bars and the gate lines are arranged in a same layer and made of a same material, and the first shorting bars are connected with the data lines by through holes penetrating through an insulating layer between the gate lines and the data lines.

* * * * *